(12) United States Patent
Fan et al.

(10) Patent No.: US 10,319,835 B2
(45) Date of Patent: Jun. 11, 2019

(54) EMBEDDED BOTTOM METAL CONTACT FORMED BY A SELF-ALIGNED CONTACT PROCESS FOR VERTICAL TRANSISTORS

(71) Applicant: International Business Machines Corporation, Armonk, NY (US)

(72) Inventors: Su Chen Fan, Cohoes, NY (US); Zuoguang Liu, Schenectady, NY (US); Heng Wu, Guilderland, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,528

(22) Filed: Nov. 15, 2017

(65) Prior Publication Data
US 2018/0337257 A1    Nov. 22, 2018

Related U.S. Application Data

(63) Continuation of application No. 15/597,662, filed on May 17, 2017, now Pat. No. 10,020,381.

(51) Int. Cl.
| H01L 29/40 | (2006.01) |
| H01L 29/66 | (2006.01) |
| H01L 29/78 | (2006.01) |
| H01L 21/768 | (2006.01) |
| H01L 29/417 | (2006.01) |

(52) U.S. Cl.
CPC ...... *H01L 29/66666* (2013.01); *H01L 21/768* (2013.01); *H01L 29/401* (2013.01); *H01L 29/41741* (2013.01); *H01L 29/7827* (2013.01)

(58) Field of Classification Search
CPC ............. H01L 29/66666; H01L 29/401; H01L 21/768; H01L 29/7827; H01L 29/41741
USPC .................. 438/212, 299; 257/401
See application file for complete search history.

(56) References Cited

U.S. PATENT DOCUMENTS

| 9,647,120 | B1* | 5/2017 | Bi | .......................... H01L 23/535 |
| 9,653,458 | B1* | 5/2017 | Cheng | ................. H01L 27/0629 |
| 9,698,227 | B2* | 7/2017 | Ng | .......................... H01L 29/407 |
| 2006/0125025 | A1* | 6/2006 | Kawashima | ........... B82Y 10/00 257/401 |

OTHER PUBLICATIONS

List of IBM Patents or Patent Applications Treated as Related (Appendix P); Filed May 8, 2018, 2 pages.

(Continued)

*Primary Examiner* — Bo Fan
(74) *Attorney, Agent, or Firm* — Cantor Colburn LLP; Vazken Alexanian

(57) ABSTRACT

Embodiments are directed to a method and resulting structures for a vertical field effect transistor (VFET) having an embedded bottom metal contact. A semiconductor fin is formed on a doped region of a substrate. A portion of the doped region adjacent to the semiconductor fin is recessed and an embedded contact is formed on the recessed portion. A material of the conductive rail is selected such that a conductivity of the embedded contact is higher than a conductivity of the doped region.

20 Claims, 12 Drawing Sheets

(56) References Cited

OTHER PUBLICATIONS

Su Chen Fan, et al. "Embedded Bottom Metal Contact Formed by a Self-Aligned Contact Process for Vertical Transistors," U.S. Appl. No. 15/597,662, filed May 17, 2017.
Su Chen Fan, et al. "Embedded Bottom Metal Contact Formed by a Self-Aligned Contact Process for Vertical Transistors," U.S. Appl. No. 15/973,745, filed May 8, 2018.
List of IBM Patents or Patent Applications Treated as Related (Appendix P); Filed Nov. 15, 2017, 2 pages.

\* cited by examiner

EMBEDDED BOTTOM METAL CONTACT FORMED BY A SELF-ALIGNED CONTACT PROCESS FOR VERTICAL TRANSISTORS

DOMESTIC AND/OR FOREIGN PRIORITY

This application is a continuation of U.S. application Ser. No. 15/597,662, titled "EMBEDDED BOTTOM METAL CONTACT FORMED BY A SELF-ALIGNED CONTACT PROCESS FOR VERTICAL TRANSISTORS" filed May 17, 2017, the entire contents of which are incorporated herein by reference.

BACKGROUND

The present invention generally relates to fabrication methods and resulting structures for semiconductor devices. More specifically, the present invention relates to embedded bottom metal contacts formed by a self-aligned (SAC) process for vertical field effect transistors (VFETs).

In contemporary semiconductor device fabrication processes a large number of semiconductor devices, such as field effect transistors (FETs), are fabricated on a single wafer. Some non-planar transistor architectures, such as VFETs, employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

SUMMARY

Embodiments of the present invention are directed to a method for fabricating a semiconductor device. A non-limiting example of the method includes forming a semiconductor fin on a doped region of a substrate. A portion of the doped region adjacent to the semiconductor fin is recessed and an embedded contact is formed on the recessed portion. A material of the embedded contact is selected such that a conductivity of the embedded contact is higher than a conductivity of the doped region.

Embodiments of the present invention are directed to a method for fabricating a semiconductor device. A non-limiting example of the method includes forming a semiconductor fin on a doped region of a substrate. A conductive gate is formed over a channel region of the semiconductor fin. A portion of the doped region adjacent to the semiconductor fin is recessed and a conductive rail is formed on the recessed portion. A dielectric layer is formed between the conductive rail and the conductive gate. A first conductive contact is formed on a surface of the conductive rail and a second conductive contact is formed on a surface of the semiconductor fin. A material of the conductive rail is selected such that a conductivity of the embedded contact is higher than a conductivity of the doped region.

Embodiments of the invention are directed to semiconductor device. A non-limiting example of the semiconductor device includes a semiconductor fin formed on a substrate. An embedded bottom contact is formed on a recessed portion of the doped region along three sides of the semiconductor fin. A material of the embedded bottom contact is selected such that a conductivity of the embedded bottom contact is higher than a conductivity of the doped region.

Embodiments of the invention are directed to semiconductor device. A non-limiting example of the semiconductor device includes a semiconductor fin formed on a substrate. A conductive gate is formed over a channel region of the semiconductor fin. A bottom spacer is formed between the conductive gate and the doped region. A conductive rail is formed on a recessed portion of the doped region and a dielectric layer is formed between the conductive rail and the conductive gate. A first conductive contact is formed on a surface of the conductive rail and a second conductive contact is formed on a surface of the semiconductor fin. A material of the conductive rail is selected such that a conductivity of the conductive rail is higher than a conductivity of the doped region.

Embodiments of the present invention are directed to a method for operating a semiconductor device. A non-limiting example of the method includes providing a semiconductor device. The device includes a semiconductor fin formed on a bottom doped region of a substrate. A conductive gate is formed over a channel region of the semiconductor fin. A top doped region is formed on a surface of the semiconductor fin and a top source/drain contact is formed on a surface of the top doped region. A conductive rail is formed on a recessed portion of the doped region and a bottom S/D contact is formed on a surface of the conductive rail. A current is passed from the top S/D contact to the bottom S/D contact through a portion of the conductive rail.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
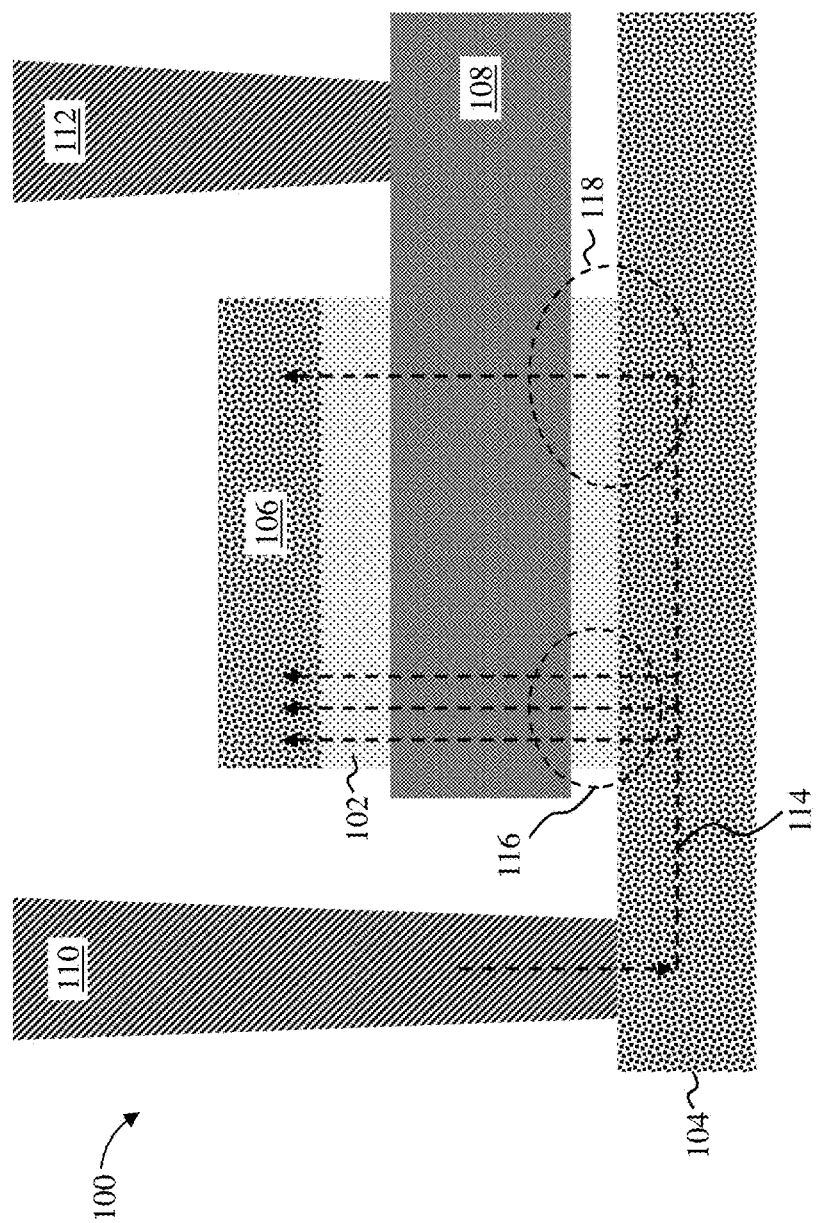
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in scaling VFETs beyond the 10 nm node. For example, aggressive scaling of the VFET architecture has placed practical constraints on the minimum resistance and the uniformity of current passing through the bottom source/drain (S/D). In particular, current passing through a conventional VFET travels along paths of variable length through the bottom S/D before reaching the channel. Paths of shortest distance, i.e., those passing through the edge of the fin closest to the bottom S/D contact, are highly preferred because current travels along paths of least resistance. Consequently, activating the VFET preferentially utilizes a portion of the channel at the edge of the fin closest to the bottom S/D contact. Remote portions of the channel further from the bottom S/D contact are poorly utilized, and consequently, device performance suffers.

Moreover, in a VFET the contact to the bottom S/D is formed in close proximity to (i.e., adjacent to) the gate. This configuration in combination with the reduced footprint of VFETs results in a large parasitic capacitance between the gate and the bottom S/D contact. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. Conventional approaches to reducing the parasitic capacitance between the gate and the bottom S/D contact have not been wholly successful. In a conventional VFET, for example, the bottom S/D contact can be formed further from the gate to somewhat mitigate this parasitic capacitance. Doing so, however, represents an area penalty that severely restricts the overall scaling factor of the VFET architecture.

Turning now to an overview of aspects of the present invention, one or more embodiments of the invention provide methods and structures configured to reduce the bottom S/D resistance and to improve current uniformity in a VFET. A highly conductive (e.g., metal) buried contact rail is formed adjacent to the bottom S/D along the entire channel of the vertical fin. The buried rail is in ohmic contact with both the bottom S/D and the bottom S/D contact and is positioned such that all electrical paths through the bottom S/D travel an equal distance before reaching the buried rail. In this manner, the effective resistance of the bottom S/D is greatly reduced and current uniformity is improved. Moreover, the buried contact rail can be embedded in a dielectric layer. Embedding the contact rail advantageously allows for the bottom S/D resistance to be reduced without increasing the bottom S/D-to-gate parasitic capacitance.

Turning now to a more detailed description of aspects of the present invention, FIG. 1 depicts a cross-sectional view of a simplified conventional VFET structure 100 having a vertical semiconductor fin 102 formed between a bottom S/D region 104 and a top S/D region 106. A conductive gate 108 is formed over a channel region of the fin 102. A bottom S/D contact 110 and a gate contact 112 are also provided. As discussed previously herein, current preferentially travels along conductive paths of least resistance. Consequently, in the conventional VFET 100 a current 114 preferentially travels the shortest path through the resistive bottom S/D region 104. Accordingly, a majority of the current 114 passes through an edge region 116 of the fin 102 closest to the bottom S/D contact 110 and a remote region 118 of the fin 102 is poorly utilized.

Figure 2:
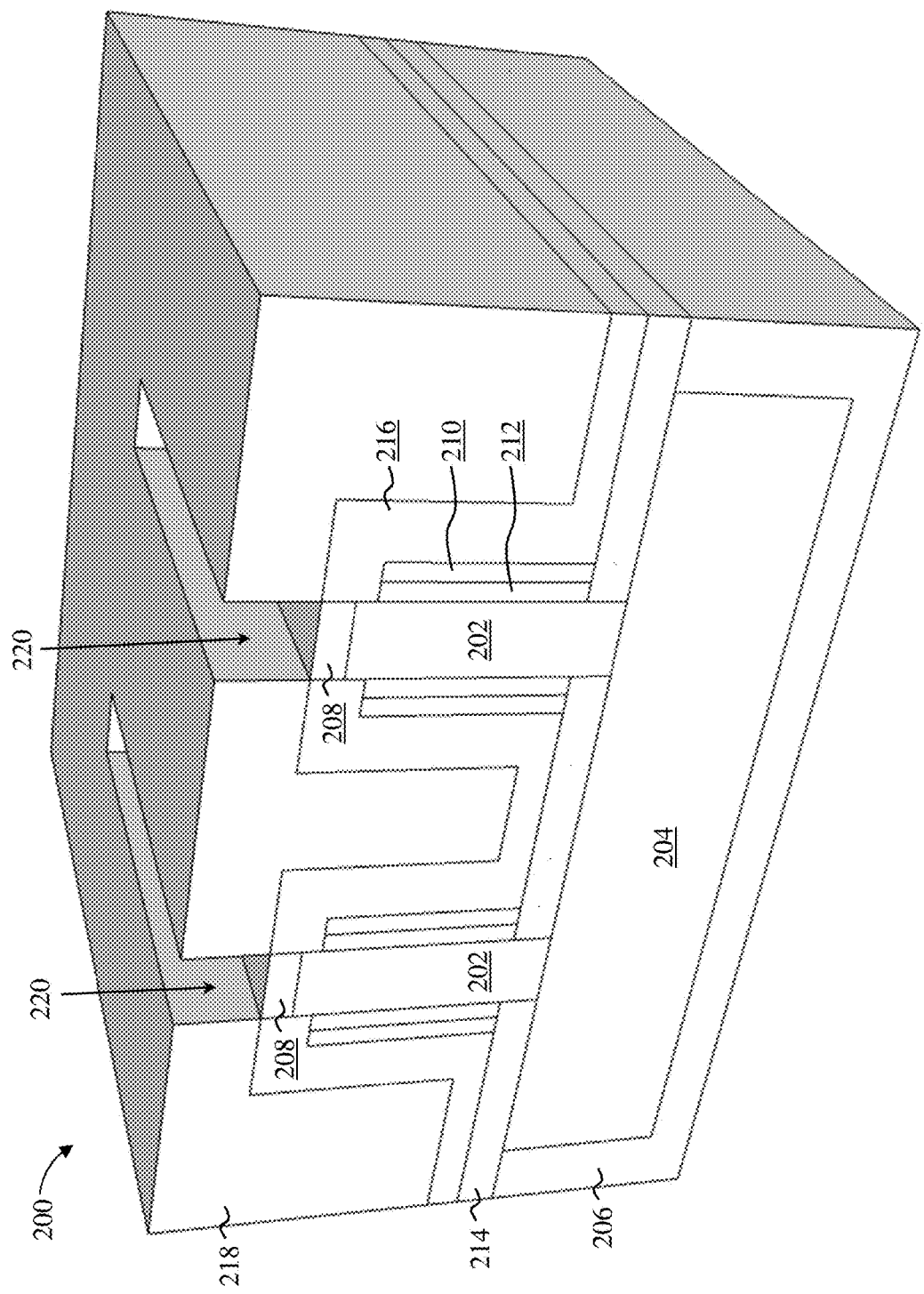
FIG. 2 depicts a cross-sectional view of the semiconductor structure after a processing operation according to one or more embodiments of the present invention.

FIG. 2 depicts a cross-sectional view of a structure 200 having vertical semiconductor fins 202 formed over a bottom doped region 204 of a substrate 206 during an intermediate operation of a method of fabricating a semiconductor device according to one or more embodiments of the invention. The vertical semiconductor fins 202 (hereinafter fins 202) can be formed over the substrate 206 using known front-end-of-line (FEOL) VFET fabrication techniques. For example, in some embodiments of the invention, a hard mask 208 is patterned to expose portions of the substrate 206. The exposed portions of the substrate 206 can then be removed to form a plurality of vertical semiconductor fins using an etch process, which can be a wet etch process, a dry etch process or a combination thereof. Each of the fins 202 can have a height ranging from 1 nm to 150 nm. Each of the fins 202 can have a width ranging from 5 nm to 40 nm. Adjacent fins 202 can be separated by a pitch ranging from 10 nm to 100 nm.

The substrate 206 can be any suitable substrate material, such as, for example, monocrystalline Si, SiGe, SiC, III-V compound semiconductor, II-VI compound semiconductor, or semiconductor-on-insulator (SOI). In some embodiments, the substrate 206 includes a buried oxide layer (not depicted). The fins 202 can be electrically isolated from other regions of the substrate 206 by a shallow trench isolation (not depicted). The shallow trench isolation can be of any suitable dielectric material, such as, for example, a silicon oxide.

The bottom doped region 204 can be a source or drain region formed on the substrate 206 by a variety of methods. In some embodiments of the present invention, the bottom doped region 204 is formed by selective epitaxial growth over the substrate 206. The bottom doped region 204 can include epitaxial semiconductor materials grown from gaseous or liquid precursors. For example, epitaxial semiconductor materials can be grown using vapor-phase epitaxy (VPE), molecular-beam epitaxy (MBE), liquid-phase epitaxy (LPE), or other suitable processes.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Epitaxial silicon, silicon germanium (SiGe), and/or carbon doped silicon (Si:C) can be doped during deposition (in-situ doped) or doped following the epitaxy by adding n-type dopants (e.g., As, P, Sb) or p-type dopants (e.g., Ga, B, BF$_2$, Al), depending on the type of transistor (i.e., n-type dopants for an nFET and p-type dopants for a pFET). The dopant concentration can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

Conductive gates 210 are formed over channel regions of the fins 202 using known VFET processes. In some embodiments of the present invention, the conductive gates 210 are overfilled above a surface of the fins 202 and then recessed below a surface of the semiconductor fins 202 using, for example, a wet or dry etch.

The conductive gates 210 can be high-k metal gates (HKMG) and can include, for example, one or more high-k dielectric films 212 and one or more work function metals (WFM, not depicted). The one or more high-k dielectric films 212 can be a dielectric material having a dielectric constant greater than, for example, 3.9, 7.0, or 10.0. Non-limiting examples of suitable materials for the high-k dielectric films 212 include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films 212 can further include dopants such as, for example, lanthanum and aluminum. The high-k dielectric films 212 can be formed by suitable deposition processes, for example, CVD, plasma enhanced CVD (PECVD), ALD, evaporation, PVD, chemical solution deposition, or other like processes. The thickness of the high-k dielectric films 212 can vary depending on the deposition process as well as the composition and number of high-k dielectric materials used. The high-k dielectric films 212 have a thickness in a range from about 0.5 to about 20 nm.

The WFM can be disposed over the high-k dielectric films 212. The type of work function metal depends on the type of transistor and can differ between the nFET and pFET devices. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The WFM can be deposited by a suitable deposition process, for example, CVD, PECVD, PVD, plating, thermal or e-beam evaporation, and sputtering.

The bulk material (gate conductor material) for the conductive gates 210 can be deposited over the high-k dielectric films 212 and WFM to form a HKMG. Non-limiting examples of suitable conductive materials include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

A bottom spacer 214 is formed between the conductive gates 210 and the substrate 206. The bottom spacer 214 can include a dielectric material, such as, for example, SiN, SiC, SiOC, SiCN, BN, SiBN, SiBCN, SiOCN, SiO$_x$N$_y$, and combinations thereof. The dielectric material can be a low-k material having a dielectric constant less than about 7, less than about 5, or even less than about 2.5. The bottom spacer 214 can be formed using known deposition processes, such as, for example, CVD, PECVD, ALD, PVD, chemical solution deposition, or other like processes. In some embodiments of the present invention, the bottom spacer 214 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as a surface of the bottom doped region 204, while avoiding deposition of any substantial amount of dielectric material on the vertically-oriented surfaces of the device, such as sidewalls of the fins 202.

A top spacer 216 is formed over the conductive gates 210 and the bottom spacer 214. The top spacer 216 can be formed in a similar manner as the bottom spacer 214 and can include a dielectric material, such as, for example, SiN, SiC, SiOC, SiCN, BN, SiBN, SiBCN, SiOCN, SiO$_x$N$_y$, and combinations thereof.

An interlayer dielectric (ILD) 218 is formed over the bottom spacer 214 and the conductive gates 210. The ILD 218 can be any suitable dielectric material, such as, for example, a silicon oxide, and can be formed using any suitable process. In some embodiments of the present invention, the ILD 218 is planarized to a surface of top spacers (not depicted) using, for example, CMP. A trench 220 is formed by removing portions of the ILD 218 using, for example, a wet etch, a dry etch, or a combination thereof. The trench 220 exposes a surface of the hard mask 208.

Figure 3:
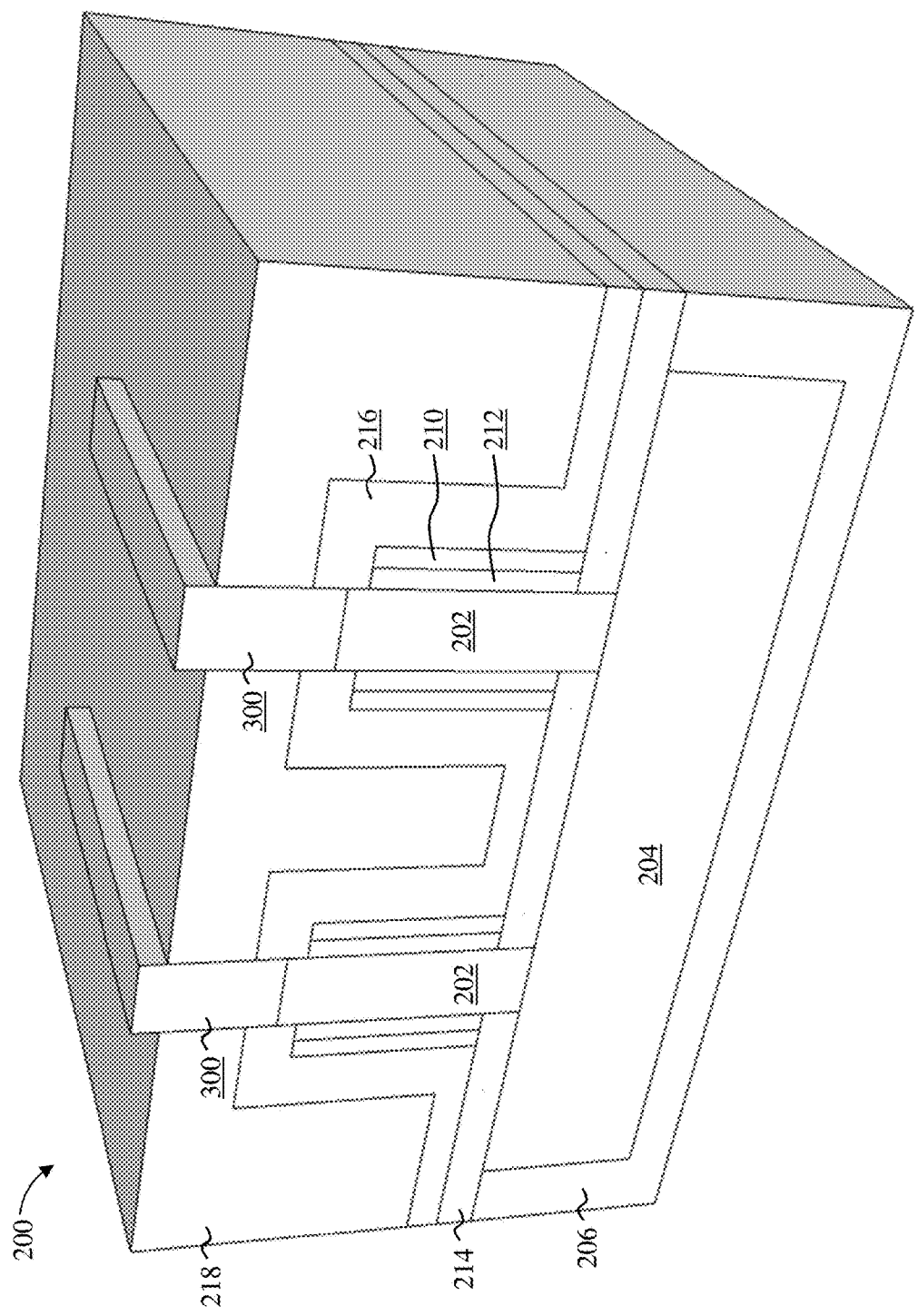
FIG. 3 depicts a cross-sectional view of the semiconductor structure after a processing operation according to one or more embodiments of the present invention.

FIG. 3 depicts a cross-sectional view of the structure 200 after forming top doped regions 300 on a surface of the fins 202 during an intermediate operation of a method of fabricating a semiconductor device according to one or more embodiments of the invention. In some embodiments of the present invention, the top doped regions 300 are epitaxially grown on a surface of the fins 202 after removing the hard mask 208. The portion of the hard mask 208 in the trench 220 can be removed using, for example, a wet etch, a dry etch, or a combination thereof, to expose a surface of the fins 202. The top doped regions 300 can then be formed on the exposed surface of the fins 202.

The top doped regions 300 can be source or drain regions epitaxially grown in a similar manner as the bottom doped region 204. For example, epitaxial materials can be grown from gaseous or liquid precursors using VPE, MBE, or LPE. The top doped regions 300 can be doped during deposition (in-situ doped) by adding dopants, n-type dopants (e.g., phosphorus or arsenic) or p-type dopants (e.g., boron or gallium), depending on the type of transistor. The dopant concentration can range from about $1\times10^{19}$ cm$^{-3}$ to about $2\times10^{21}$ cm$^{-3}$, for example, between about $2\times10^{20}$ cm$^{-3}$ to about $1\times10^{21}$ cm$^{-3}$.

Figure 4:
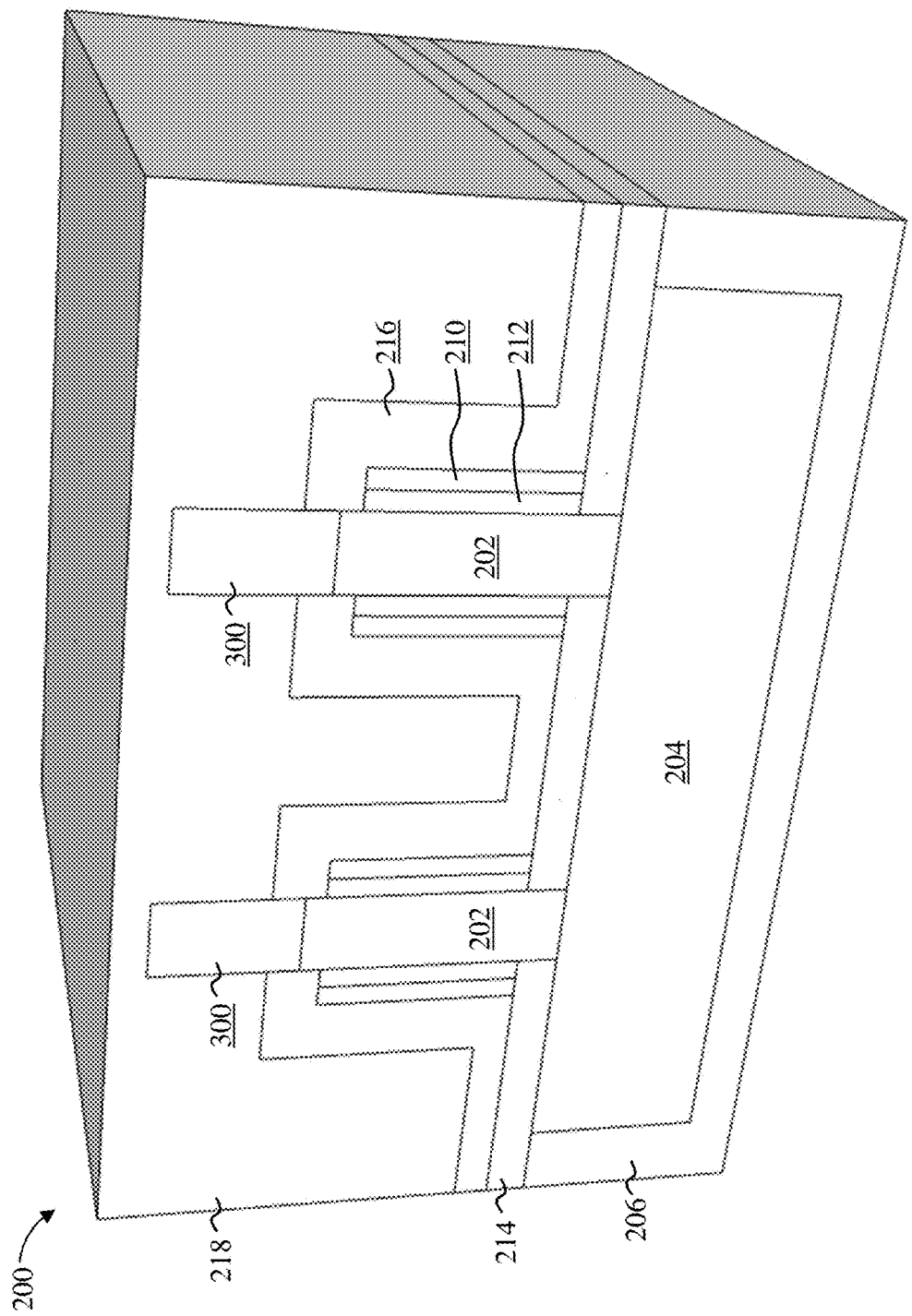
FIG. 4 depicts a cross-sectional view of the semiconductor structure after a processing operation according to one or more embodiments of the present invention.

FIG. 4 depicts a cross-sectional view of the structure 200 after refilling the ILD 218 over a surface of the top doped regions 300 during an intermediate operation of a method of fabricating a semiconductor device according to one or more embodiments of the invention. The ILD 218 can be refilled with a same dielectric material or a different dielectric material as that used in the initial ILD 218 deposition (as depicted in FIG. 2). In some embodiments of the present invention, the ILD 218 is planarized using, for example, CMP.

Figure 5:
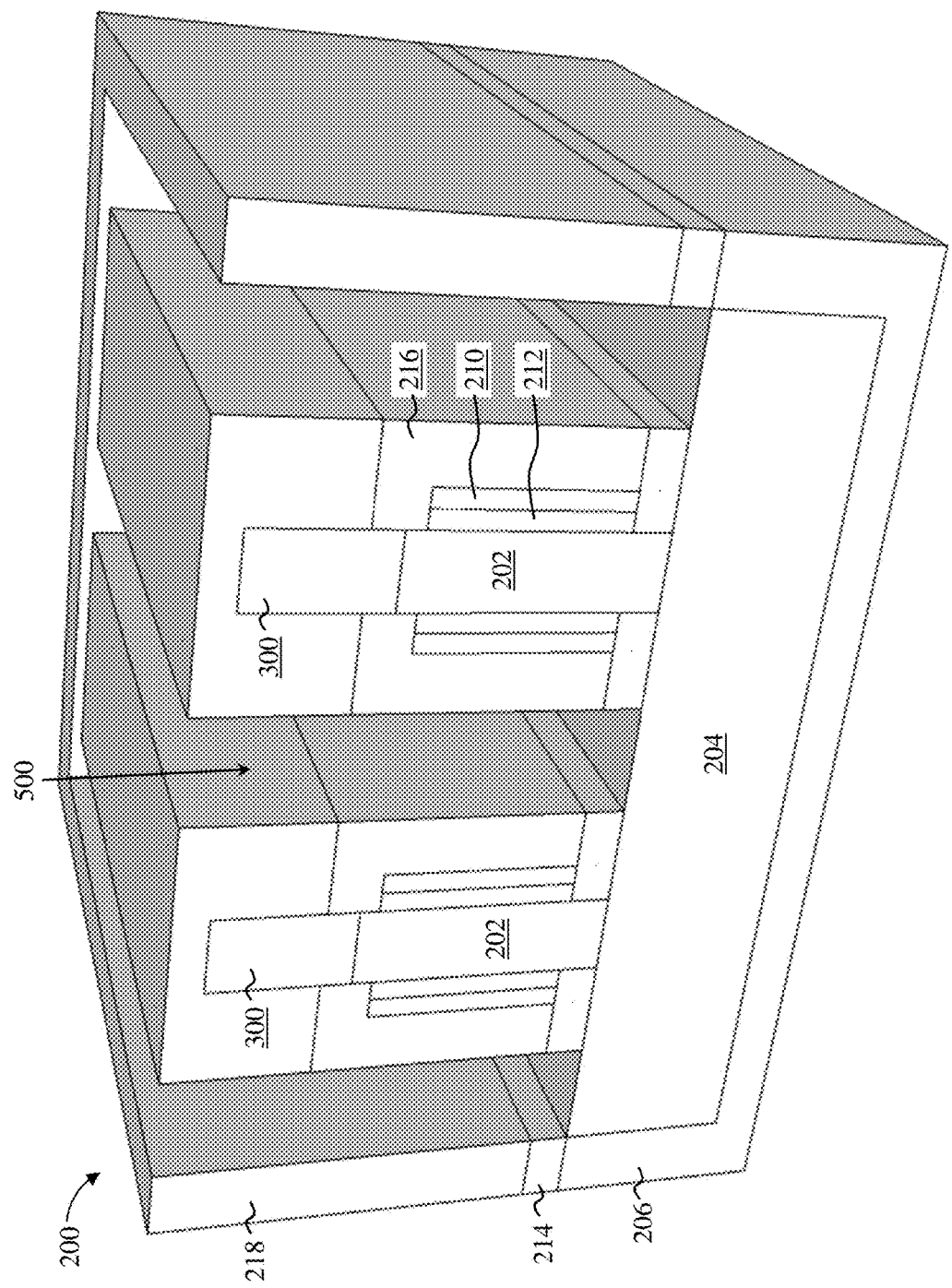
FIG. 5 depicts a cross-sectional view of the semiconductor structure after a processing operation according to one or more embodiments of the present invention.

FIG. 5 depicts a cross-sectional view of the structure 200 after forming a trench 500 exposing portions of the bottom doped region 204 during an intermediate operation of a method of fabricating a semiconductor device according to one or more embodiments of the invention. The trench 500 wraps around three sides of the fins 202 and can be formed using, for example, a wet etch, a dry etch, or a combination thereof. In some embodiments of the present invention, portions of the bottom doped region 204 are exposed using a series of RIE etches. For example, a first RIE can remove portions of the ILD 118 selective to the top spacer 216 to form the trench 500. In this manner, the trench 500 can be formed self-aligned to the top spacer 216. A second RIE can remove portions of the top spacer 216 in the trench 500. A third RIE can remove portions of the bottom spacer 214 in the trench 500 selective to the bottom doped region 204.

Figure 6:
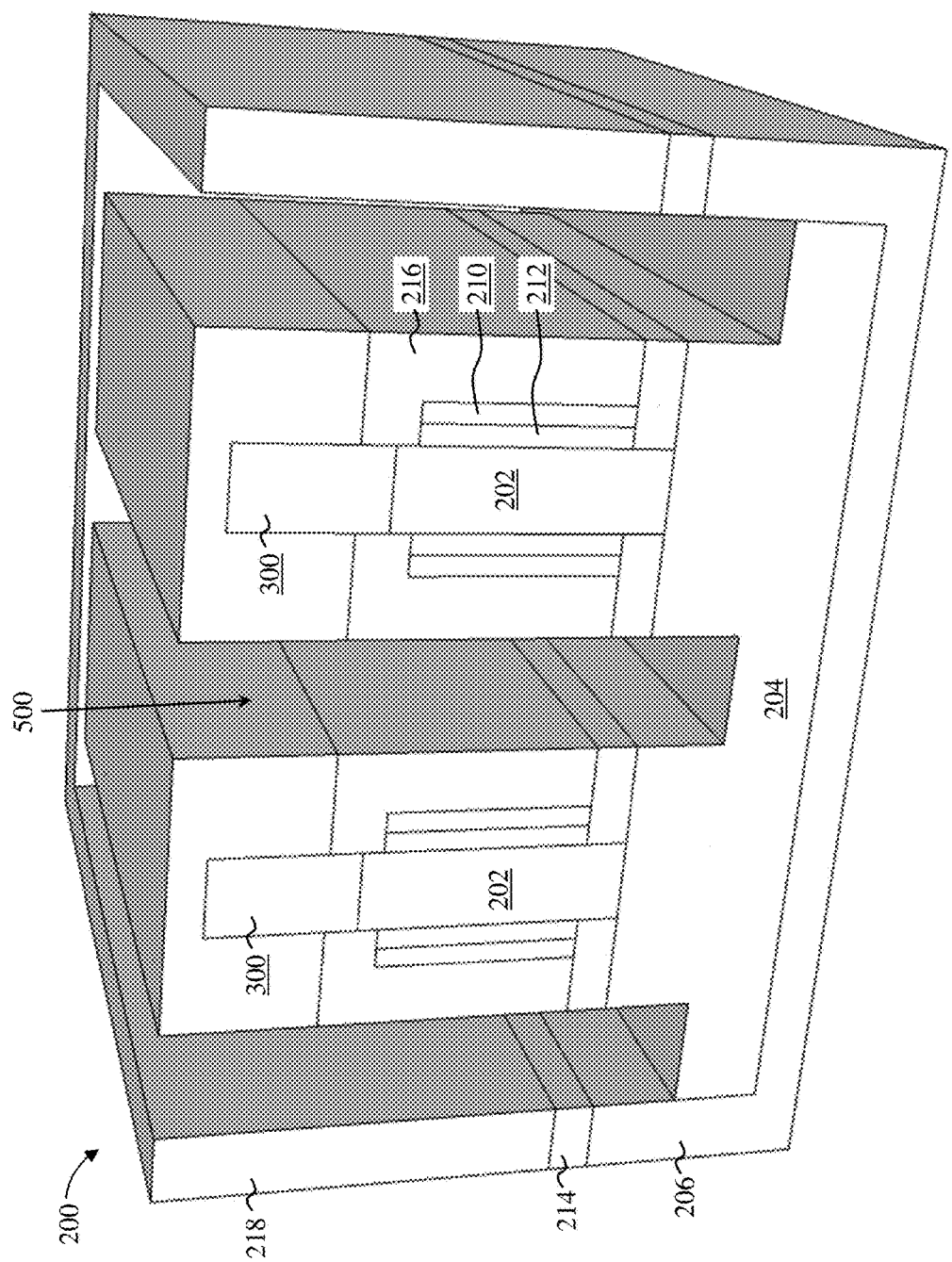
FIG. 6 depicts a cross-sectional view of the semiconductor structure after a processing operation according to one or more embodiments of the present invention.

FIG. 6 depicts a cross-sectional view of the structure 200 after recessing portions of the bottom doped region 204 in the trench 500 during an intermediate operation of a method of fabricating a semiconductor device according to one or more embodiments of the invention. The bottom doped region 204 can be recessed using, for example, a wet etch, a dry etch, or a combination thereof. In some embodiments of the present invention, the bottom doped region 204 is recessed about 10 to about 15 nm, although other recess depths are within the contemplated scope of the invention.

Figure 9:
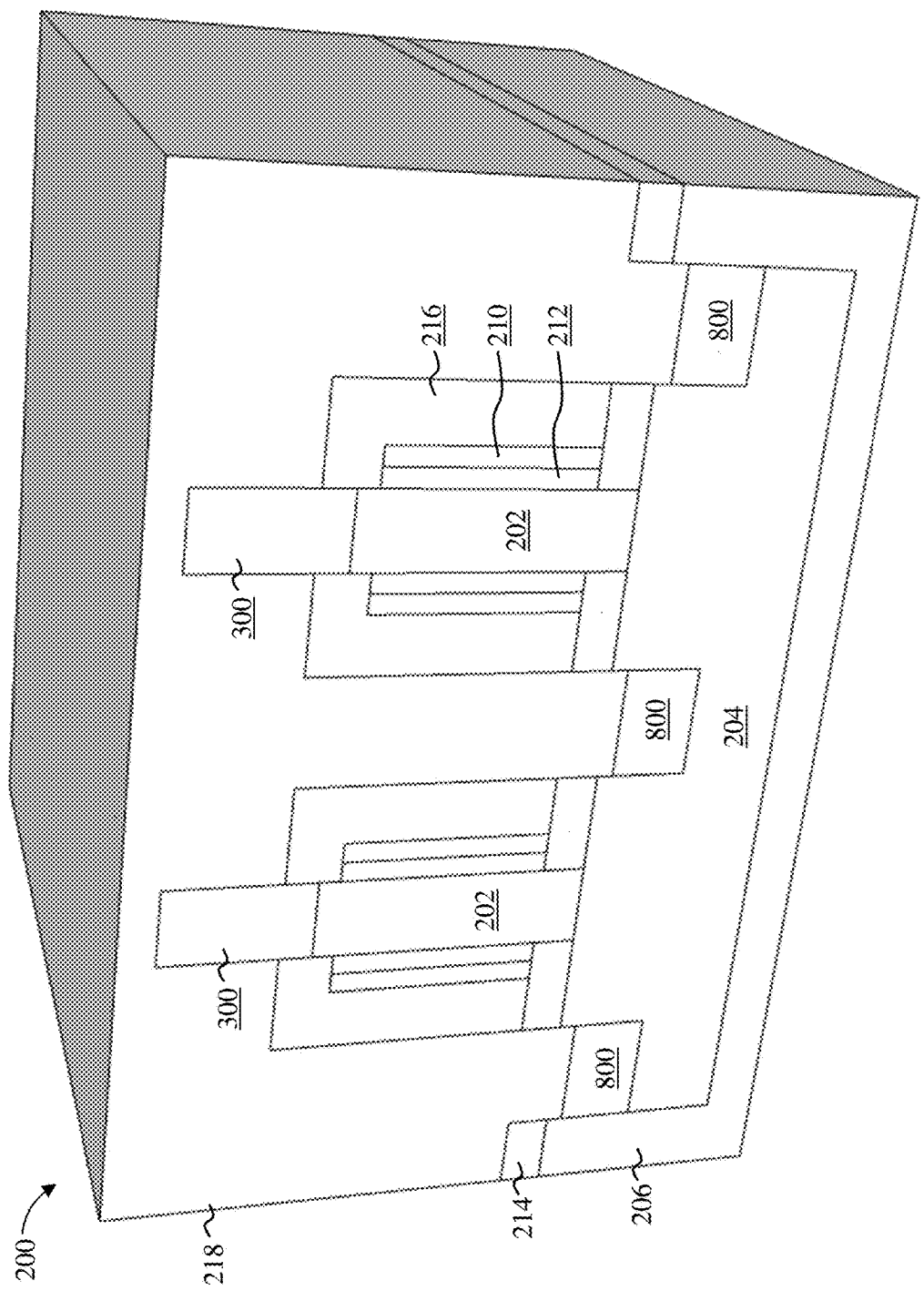
FIG. 9 depicts a cross-sectional view of the semiconductor structure after a processing operation according to one or more embodiments of the present invention.

The bottom doped region 204 is recessed such that the conductive rail 800 can be buried below a dielectric layer (as depicted in FIG. 9).

Figure 7:
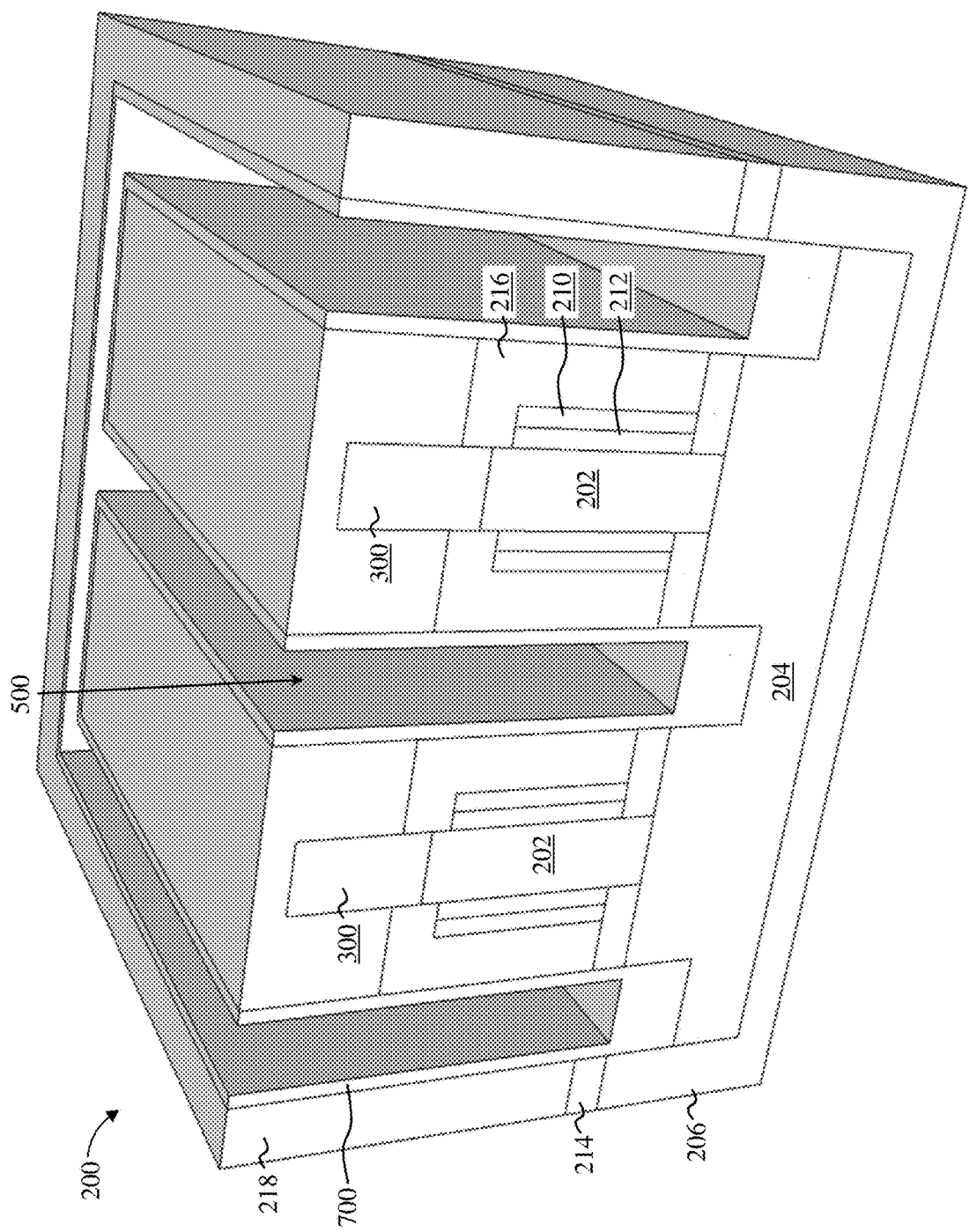
FIG. 7 depicts a cross-sectional view of the semiconductor structure after a processing operation according to one or more embodiments of the present invention.

FIG. 7 depicts a cross-sectional view of the structure 200 after forming a conductive layer 700 over the bottom doped region 204 and sidewalls of the trench 500 during an intermediate operation of a method of fabricating a semiconductor device according to one or more embodiments of the invention. The conductive layer 700 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The material for the conductive layer 700 is selected such that the conductivity of the conductive rail 800 (as depicted in FIG. 8) is much higher than (e.g., more than twice) the conductivity of the bottom doped region 204.

The conductive layer 700 can be conformally formed using, for example, CVD, PECVD, ALD, PVD, chemical solution deposition, or other like processes. In some embodiments of the present invention, the conductive layer 700 is Ti formed using PVD. PVD deposition advantageously deposits a thicker layer (e.g., about 10 to about 15 nm) at the bottom of the trench 500 and a thin layer (e.g., less than about 2 nm) on sidewalls of the trench 500.

Figure 8:
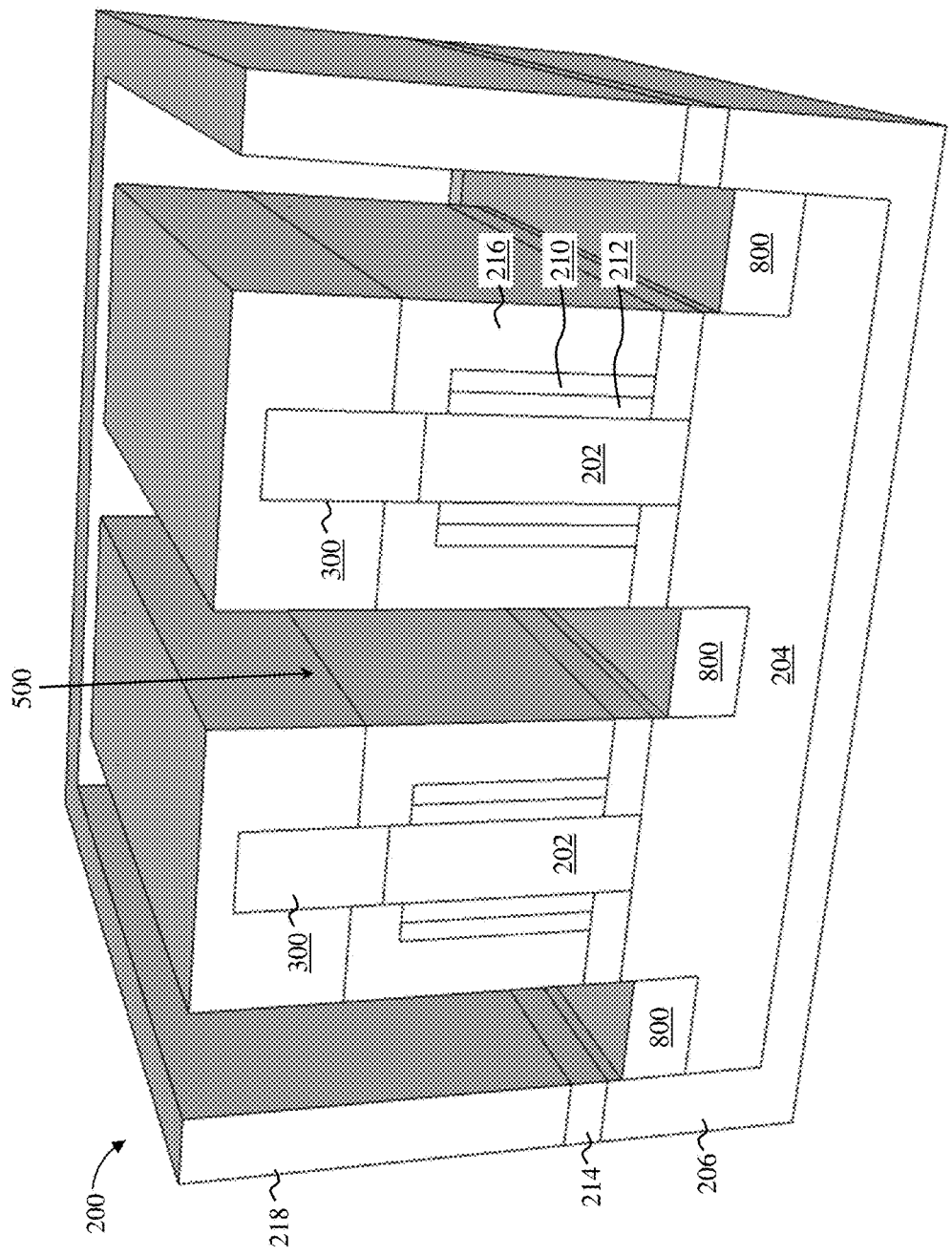
FIG. 8 depicts a cross-sectional view of the semiconductor structure after a processing operation according to one or more embodiments of the present invention.

FIG. 8 depicts a cross-sectional view of the structure 200 after recessing the conductive layer 700 from sidewalls of the trench 500 during an intermediate operation of a method of fabricating a semiconductor device according to one or more embodiments of the invention. The conductive layer 700 can be recessed using, for example, a wet etch, a dry etch, or a combination thereof. In some embodiments of the present invention, the conductive layer 700 is recessed using SC1 ($H_2O_2/NH_4OH$). The removal process exposes sidewalls of the top spacer 216 and recesses portions of the conductive layer 700 at the bottom of the trench 500. In some embodiments of the present invention, the remaining portions of the conductive layer 700 at the bottom of the trench 500 are recessed about 3 nm to about 5 nm below a surface of the bottom spacer 214. These remaining portions of the conductive layer 700 define a conductive rail 800 (also known as a buried or embedded bottom contact) wrapping around three sides of the fins 202. The conductive rail 800 can have a thickness of about 7 to about 12 nm, although other thicknesses are within the contemplated scope of the invention.

FIG. 9 depicts a cross-sectional view of the structure 200 after filling the trench 500 with dielectric material during an intermediate operation of a method of fabricating a semiconductor device according to one or more embodiments of the invention. The trench 500 can be filled with a same dielectric material or a different dielectric material as that used in the initial ILD 218 deposition (as depicted in FIG. 2). In some embodiments of the present invention, the ILD 218 is planarized using, for example, CMP.

Figure 10:
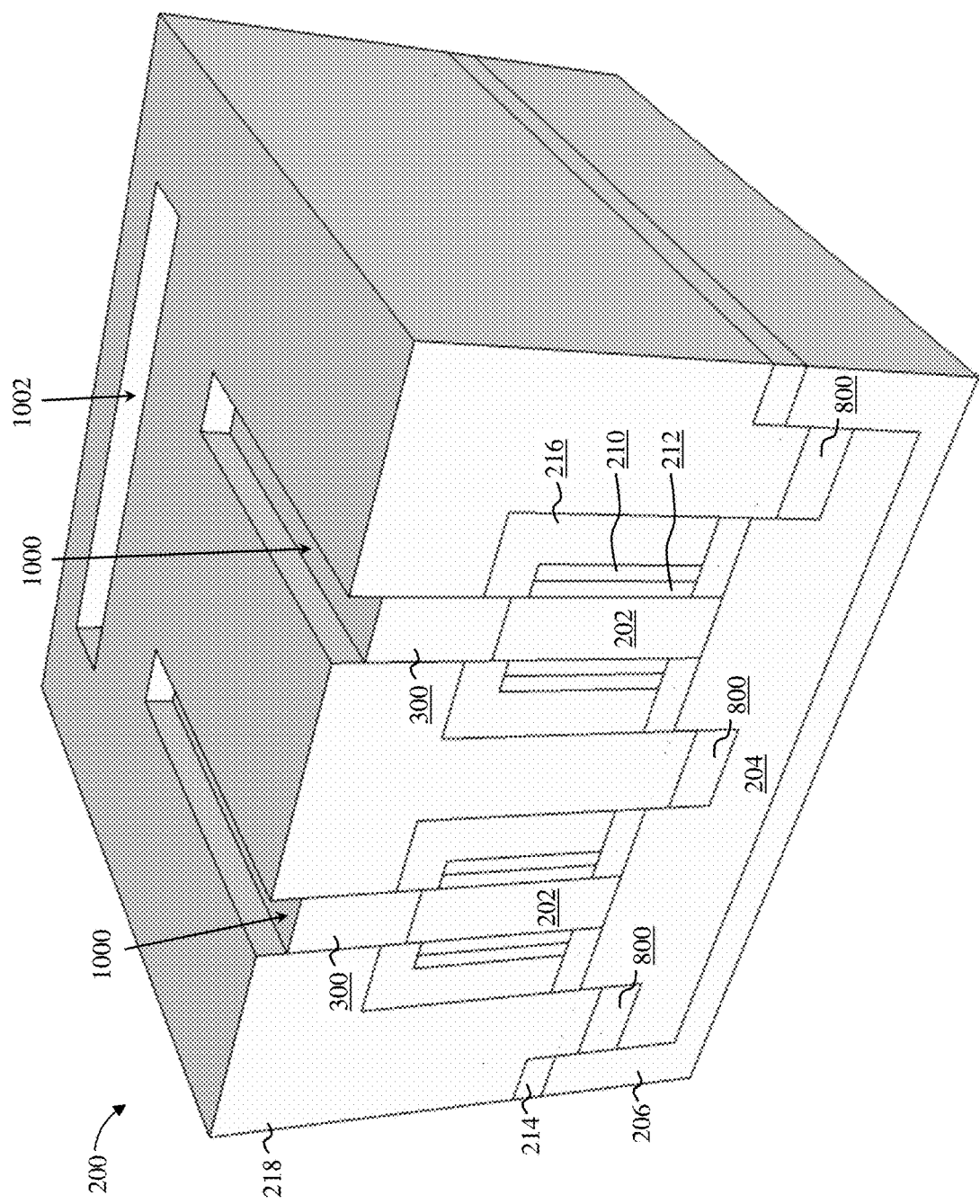
FIG. 10 depicts a cross-sectional view of the semiconductor structure after a processing operation according to one or more embodiments of the present invention.
Figure 11:
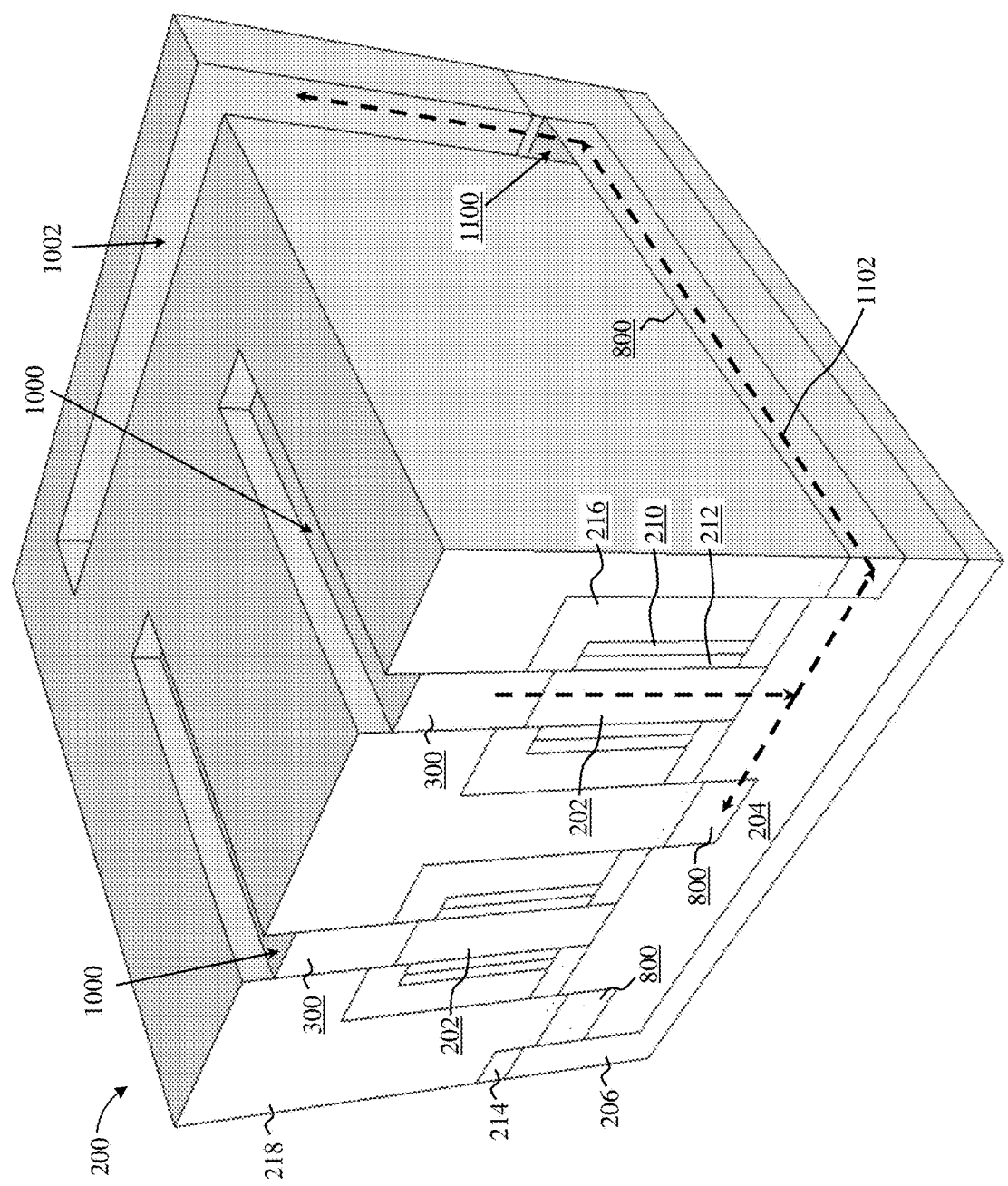
FIG. 11 depicts a cross-sectional view of the semiconductor structure after a processing operation according to one or more embodiments of the present invention.

FIG. 10 depicts a cross-sectional view of the structure 200 after forming a trench 1000 exposing surfaces of the top doped regions 300 during an intermediate operation of a method of fabricating a semiconductor device according to one or more embodiments of the invention. A trench 1002 is also formed exposing a surface 1100 of the conductive rail 800 (as depicted in FIG. 11). The ILD 218 can be patterned using, for example, a wet etch, a dry etch, or a combination thereof.

The trenches 1000 and 1002 are then filled with conductive contacts (not depicted) using known VFET metallization techniques. For example, in some embodiments of the present invention, the ILD 218 is extended and the contacts are deposited into the trenches 1000 and 1002. In some embodiments of the present invention, the contacts are overfilled into the trenches, forming overburdens above a surface of the ILD 218. CMP can be used to remove the overburden.

The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In some embodiments of the present invention, the contacts can be copper or tungsten and can include a barrier metal liner (not depicted). The barrier metal liner prevents the copper or tungsten from diffusing into, or doping, the surrounding materials, which can degrade their properties. Silicon, for example, forms deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

In some embodiments of the present invention, the contacts include a metal (e.g., titanium) that reacts with semiconductor materials (e.g., the top doped regions 300) to form a silicide film (not depicted) between the top doped regions 300 and the contacts. As the silicide film is only formed at the interface between the contacts and the top doped regions 300 the silicide film can be said to be self-aligned to the top doped regions 300 (a self-aligned silicide is also referred to as a salicide).

FIG. 11 depicts a cross-sectional view of the structure 200 having a conductive path 1102 (also known as an electrical path or channel path) during an ON state according to one or more embodiments of the invention. FIG. 11 illustrates an alternative view of the structure 200 as depicted in FIG. 10, except that the cross-sectional view of the structure 200 is now taken along an edge of the trench 1002. From this view it is clear that the trench 1002 exposes a surface of the conductive rail 800.

The conductive path 1102 starts at the top doped region 300, passes through the channel region of the fin 202, and cross the bottom doped region 204 to the conductive rail 800. As discussed previously herein, the conductive rail 800 is formed using highly conductive materials (e.g., from metal) having a higher conductivity than the bottom doped region 204. Consequently, current passing through the fins 202 to reach the conductive rail 800 will preferentially travel the shortest available path through the bottom doped region 204. The shortest available path through the bottom doped region 204 is constant along the entire length of the channel and is the straight-line distance between the fins 202 and the conductive rail 800. In other words, all electrical paths travel an equal distance through the bottom doped region 204 before reaching the conductive rail 800. In this manner, the effective resistance of the bottom doped region 204 is reduced and the uniformity of current passing through the bottom doped region 204 is improved.

Figure 12:
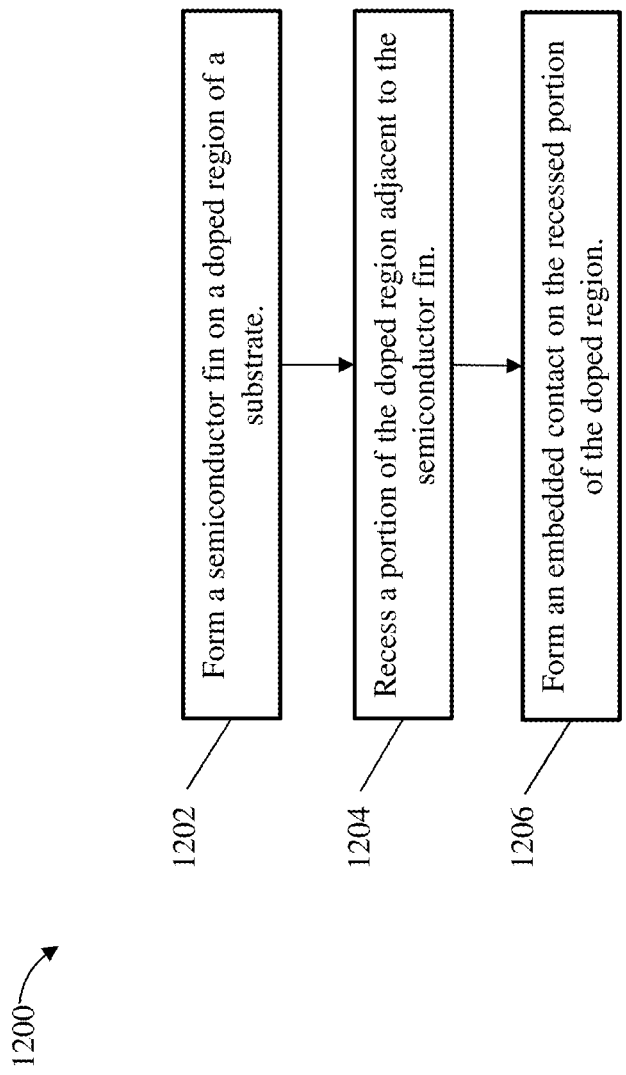
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1202, a semiconductor fin is formed on a doped region of a substrate. The semiconductor fin can be formed in a similar manner as the fins 202 depicted in FIG. 2 according to one or more embodiments.

As shown at block 1204, a portion of the doped region adjacent to the semiconductor fin is recessed. The doped region can be recessed in a similar manner as the bottom doped region 204 depicted in FIG. 6 according to one or more embodiments.

As shown at block 1206, an embedded contact is formed on the recessed portion of the doped region. The embedded contact can be formed in a similar manner as the conductive rail 800 as depicted in FIGS. 7 and 8 according to one or more embodiments. As discussed previously herein, a material of the embedded contact is selected such that the conductivity of the embedded contact is higher than a conductivity of the doped region of the substrate.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a semiconductor fin on a doped region of a substrate;
    recessing a surface of the doped region, the recessed surface comprising a first portion adjacent to a first sidewall of the semiconductor fin, a second portion adjacent to a second sidewall of the semiconductor fin, and a third portion adjacent to a third sidewall of the semiconductor fin; and
    forming a conductive layer on the first portion, the second portion, and the third portion of the recessed surface of the doped region;
    wherein a conductivity of the conductive layer is higher than a conductivity of the doped region.

2. The method of claim 1 further comprising forming a conductive gate over a channel region of the semiconductor fin.

3. The method of claim 2 further comprising forming a bottom spacer between the doped region and the conductive gate.

4. The method of claim 3 further comprising forming a top spacer over the conductive gate and the bottom spacer.

5. The method of claim 1 further comprising forming a conductive contact on a surface of the semiconductor fin.

6. The method of claim 1 further comprising forming a conductive contact on a surface of the conductive layer.

7. The method of claim 1, wherein the conductive layer wraps around three sides of the semiconductor fin.

8. The method of claim 1, wherein the conductive layer comprises a metal.

9. The method of claim 1, wherein the conductive layer comprises titanium.

10. The method of claim 1, wherein forming the conductive layer comprises conformally depositing a conductive material over the recessed surface of the doped region and over sidewalls of the conductive gate.

11. The method of claim 10, wherein forming the conductive layer further comprises removing the portions of the conductive layer deposited on sidewalls of the conductive gate.

12. The method of claim 1, wherein the recessed surface of the doped region is recessed about 10 to about 15 nm.

13. A method for forming a semiconductor device, the method comprising:
    forming a semiconductor fin on a doped region of a substrate;
    forming a conductive gate over a channel region of the semiconductor fin;
    recessing a portion of the doped region adjacent to the semiconductor fin;
    forming a conductive rail on the recessed portion of the doped region;
    forming a dielectric layer between the conductive rail and the conductive gate;
    forming a first conductive contact on a surface of the conductive rail; and
    forming a second conductive contact on a surface of the semiconductor fin;
    wherein a conductivity of the conductive rail is higher than a conductivity of the doped region.

14. The method of claim 13, wherein the conductive rail wraps around three sides of the semiconductor fin.

15. The method of claim 13, wherein the conductive rail comprises a metal.

16. The method of claim 15, wherein forming the conductive rail comprises depositing the metal over the recessed portion of the doped region and over sidewalls of the conductive gate.

17. The method of claim 16, wherein forming the conductive rail further comprises removing the portions of the conductive rail deposited on sidewalls of the conductive gate.

18. The method of claim 13, wherein the conductive rail comprises a thickness of about 7 to about 12 nm.

19. A method of operating a semiconductor device, the method comprising:
    providing a semiconductor device comprising:
        a semiconductor fin on a bottom doped region of a substrate;
        a conductive gate formed over a channel region of the semiconductor fin;
        a top doped region on a surface of the semiconductor fin;
        a top source/drain (S/D) contact on a surface of the top doped region;
        a conductive rail on a recessed portion of the doped region; and
        a bottom S/D contact on a surface of the conductive rail; and
    passing a current from the top S/D contact to the bottom S/D contact through a portion of the conductive rail.

20. The method of claim 19 further comprising a first conductive path passing through a first portion of the semiconductor fin and a second conductive path passing through a second portion of the semiconductor fin.

* * * * *